United States Patent [19]
Yoshida

[11] Patent Number: 5,885,142
[45] Date of Patent: Mar. 23, 1999

[54] DEVICE FOR CLEANING A LIQUID CRYSTAL PANEL

[75] Inventor: Hitoshi Yoshida, Tokyo, Japan

[73] Assignee: NEC Corporation, Tokyo, Japan

[21] Appl. No.: 883,661

[22] Filed: Jun. 27, 1997

[30] Foreign Application Priority Data

Jun. 28, 1996 [JP] Japan ................................ 8-169735

[51] Int. Cl.$^6$ .................................................. B24B 7/02
[52] U.S. Cl. .......................... 451/160; 457/277; 457/406; 269/310; 269/903
[58] Field of Search ............................. 457/160, 41, 222, 457/406, 411, 5, 28, 908, 54, 43, 44, 55; 269/310, 903, 21

[56] References Cited

U.S. PATENT DOCUMENTS

| | | | |
|---|---|---|---|
| 3,998,444 | 12/1976 | Stockwell | 269/310 |
| 5,054,244 | 10/1991 | Takamatsu et al. | 451/411 |
| 5,152,707 | 10/1992 | Dougherty et al. | 269/21 |
| 5,562,529 | 10/1996 | Kishii et al. | 451/908 |
| 5,673,167 | 9/1997 | Davenport et al. | 269/903 |

FOREIGN PATENT DOCUMENTS

| | | |
|---|---|---|
| 61-89819 | 6/1986 | Japan . |
| 4-270317 | 9/1992 | Japan . |
| 7-218882 | 8/1995 | Japan . |
| 8-220517 | 8/1996 | Japan . |

*Primary Examiner*—Robert A. Rose
*Assistant Examiner*—George Nguyen
*Attorney, Agent, or Firm*—Whitham, Curtis & Whitham

[57] ABSTRACT

A liquid crystal (LC) panel cleaning device of the present invention includes a work table and a terminal seat located above the work table. While the cleaning device is in operation, the terminal seat sustains a terminal portion included in an LC panel against a pressure acting on the terminal portion. The terminal seat is connected to ground. This successfully protects the terminal portion from damage and prevents devices built in the panel from being damaged by static electricity.

4 Claims, 5 Drawing Sheets

DEVICE FOR CLEANING A LIQUID CRYSTAL PANEL

BACKGROUND OF THE INVENTION

The present invention relates to a device for cleaning a liquid crystal (LC) panel and, more particularly, to a device capable of cleaning an LC panel with an abrasive member thereof rotating on and pressingly contacting the surface of the panel.

Various kinds of LC panel cleaning devices are taught in, e.g., Japanese Patent Laid-Open Publication Nos. 7-218882, 4-270317 and 8-220517 as well as in Japanese Utility Model Laid-Open Publication No. 61-89819. However, a problem with the conventional cleaning devices is that while a cleaning head cleans the surface of an LC panel and a terminal portion included in the panel, the head presses even the terminal portion and is apt to damage it. Another problem is that static electricity ascribable to the movement of the cleaning head on the LC panel charges the panel and is likely to damage devices built in the panel due to shorting.

SUMMARY OF THE INVENTION

It is therefore an object of the present invention to provide an LC panel cleaning device capable of cleaning an LC panel without damaging a terminal included in the panel, and preventing devices built in the panel from being damaged by static electricity.

A device for cleaning a surface of an LC panel including two substrates adhered together of the present invention includes a cleaning head. The cleaning head has a first mechanism for causing its abrasive member to rotate in the direction parallel to the panel and lowering the abrasive member into contact with the surface of the panel, and a second mechanism for causing the abrasive member to move in a desired direction in contact with the surface of the panel. A work stage retains the panel. A terminal seat sustains, when the panel is lowered onto the work stage, a terminal portion included in the panel while being pressed downward by the terminal portion against a force of a biasing member constantly biasing the terminal seat.

BRIEF DESCRIPTION OF THE DRAWINGS

The above and other objects, features and advantages of the present invention will become apparent from the following detailed description taken with the accompanying drawings in which.

DESCRIPTION OF THE PREFERRED EMBODIMENTS

Figure 1:
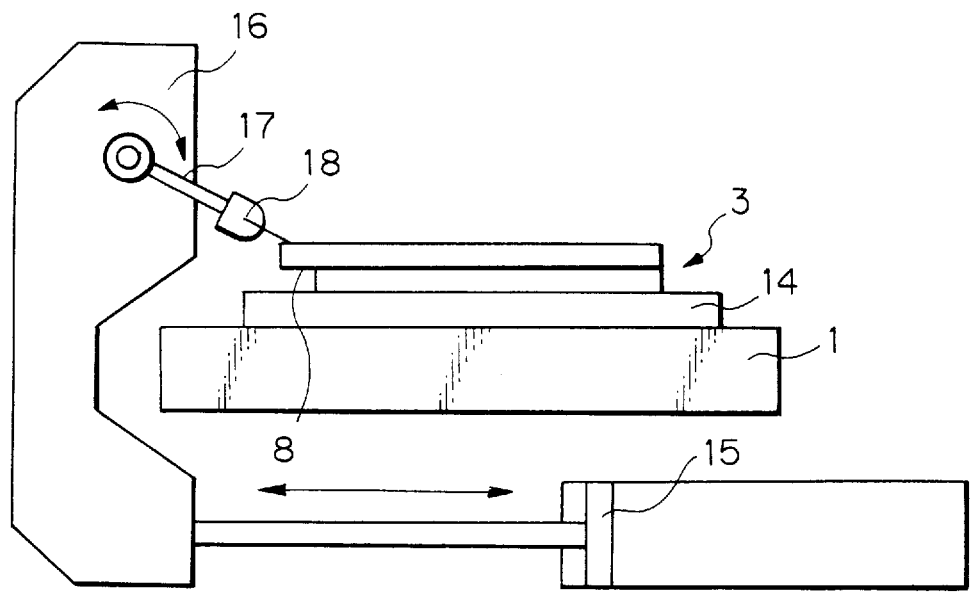
FIGS. 1, 2 and 3 are side elevations each showing a particular conventional arrangement for cleaning an LC panel.

To better understand the present invention, brief reference will be made to a conventional LC panel cleaning device, shown in FIG. 1. The cleaning device to be described is taught in Japanese Patent Laid-Open Publication No. 7-218882 mentioned earlier. As shown, the cleaning device includes a work table 1, a flat work stage 14 mounted on the work table 1 and loaded with an LC panel 3, and a bracket 16. An air cylinder 15 is disposed below the work table 1 and operatively connected to the bracket 16. A shaft 17 is pivotable above the work stage 14. A squeegee 18 is affixed to the free end of the shaft 17 in order to shave off impurities existing on the surface of the panel 3. To clean the panel 3, the shaft 17 is pivotally moved downward until the squeegee 18 has been pressed against the surface of the panel 3. In this condition, the squeegee 18 is moved on and along the surface of the panel 3.

The above conventional cleaning device has the following problems left unsolved. The panel 3 loaded on the work stage 14 has two substrates of different sizes adhered together, and therefore includes a stepped terminal portion 8 spaced above the work stage 14. When the surface of the panel 3 and terminal portion 8 are cleaned, a load acts even on the end of the portion 8 vertically and is likely to damage the portion 8. Further, the squeegee 18 moving in pressing contact with the panel 3 generates static electricity. The static electricity charges the panel 3 whose terminal portion 3 is spaced from the work stage 14. As a result, it is likely that devices built in the panel 3 are shorted and electrostatically damaged, obstructing the expected operation of the panel 3.

Figure 2:
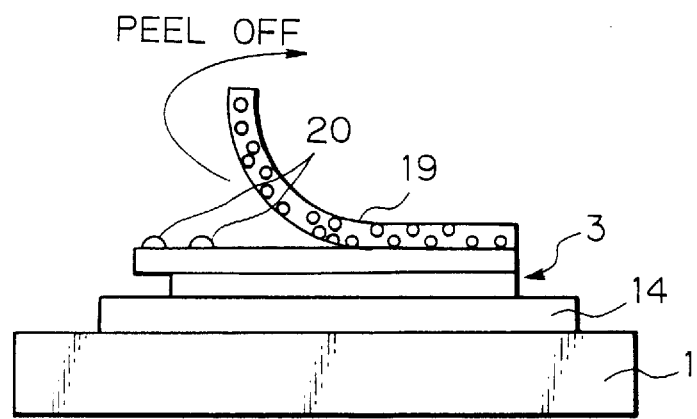

FIG. 2 shows another conventional cleaning device which is disclosed in Japanese Patent Laid-Open Publication No. 4-270317 also mentioned earlier. As shown, the cleaning device uses a peelable protection film 19. After the two substrates of the LC panel 3 have been adhered together, the surface of the panel 3 is covered with the protection film 19. The protection film 19 is peeled off before a polarizer is adhered to the panel 3.

However, a drawback with the above projection film scheme is that when the film 19 is peeled off from the panel 3, the resulting static electricity charges the panel 3. The static electricity brings about the same problem as discussed above in relation to the squeegee scheme. Another drawback is that when the film 19 is peeled off, it partly remains on the panel 3 and turns out an impurity 20. The impurity 20 on the panel 3 is apt to deteriorate the displaying function of the panel 3.

Figure 3:
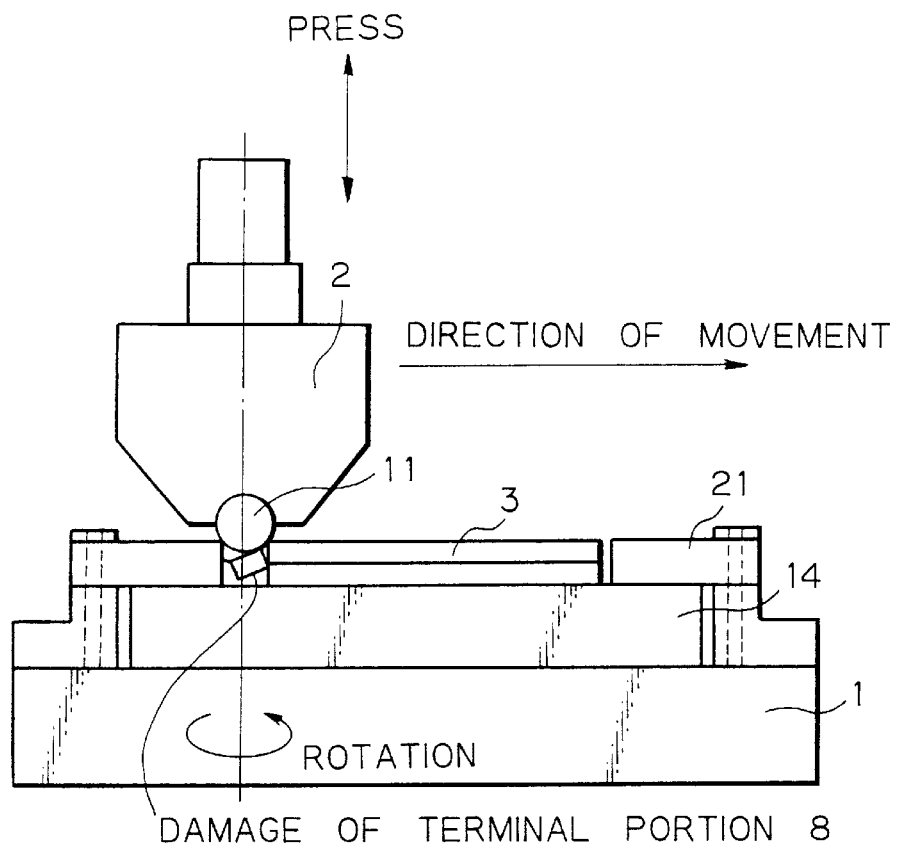
Figure 4:
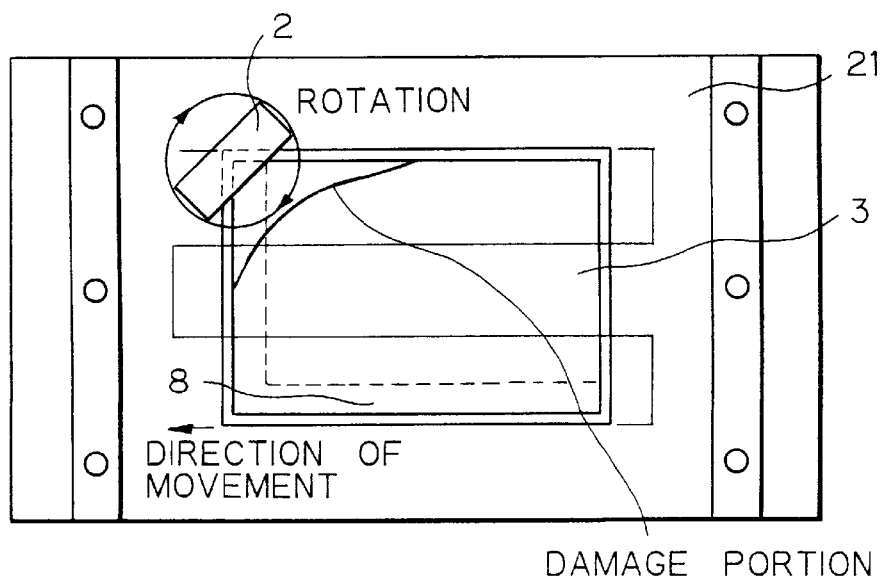
FIG. 4 is a plan view showing how a cleaning head included in the arrangement of FIG. 3 is moved.

FIGS. 3 and 4 show still another conventional cleaning device. As shown in FIG. 3, the cleaning device also includes the work table 1 and flat work stage 14 loaded with the LC panel 3. An abrasive member 11 is implemented as a tape and cleans the surface of the panel 3. A cleaning head 2 includes a mechanism, not shown, for causing the abrasive member 11 to rotate in the direction parallel to the surface of the panel 3 and pressing the former against the latter. A guide 21 surrounds the panel 3 and includes a moving mechanism, not shown, for moving the cleaning head 2 up and down. In operation, after the panel 3 has been positioned on the work stage 14, the guide 21 and therefore the head 2 is lowered in order to press the abrasive member 11, which is in rotation, against the surface of the panel 3. Then, as shown in FIG. 4, the head 2 is caused to move zigzag such that the abrasive member 11 cleans the entire surface of the panel 3.

The above cleaning head scheme also has the problems discussed in relation to the squeegee scheme shown in FIG. 1. Specifically, when the surface of the panel 3 and terminal portion 8 are cleaned, the head 2 exerts a load even on the end of the portion 8 vertically and is apt to damage the portion 8. Further, the abrasive member 11 moving in pressing contact with the panel 3 generates static electricity. The static electricity charges the panel 3 whose terminal portion 8 is spaced from the work stage 14. As a result, it is likely that the devices built in the panel 3 are shorted and electrostatically damaged, obstructing the expected operation of the panel 3.

Figure 5:
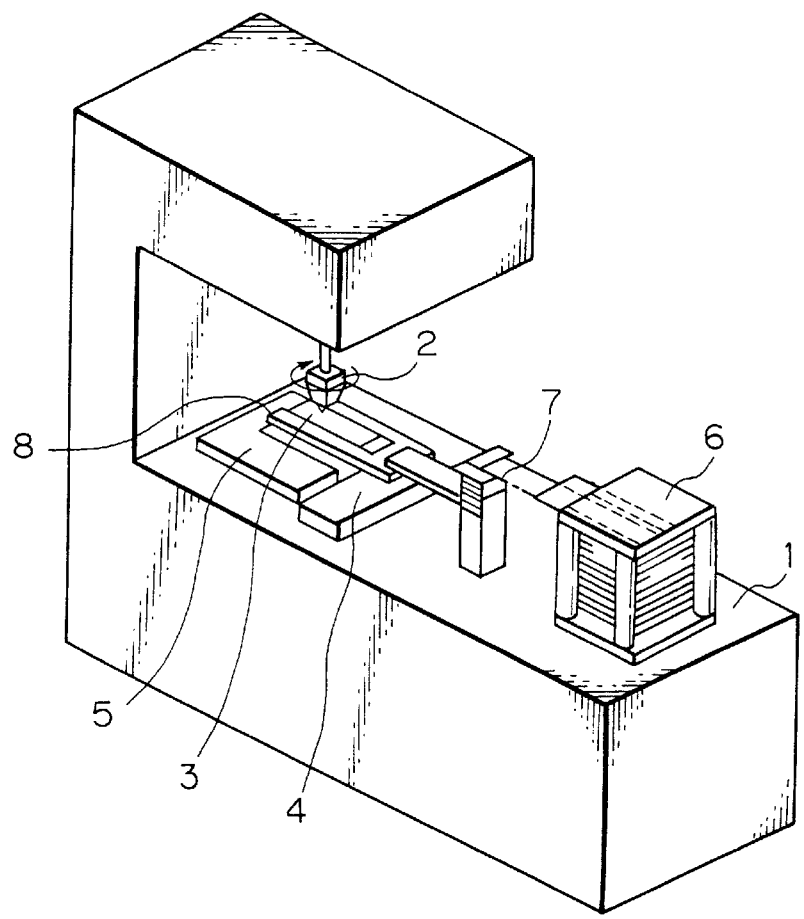
FIG. 5 is a perspective view showing an LC panel cleaning device embodying the present invention.

Referring to FIG. 5, an LC panel cleaning device embodying the present invention will be described. As shown, the cleaning device includes a work table 1. A cassette 6 accommodates a plurality of LC panels 3 therein and allows them to be pulled out one by one. A cleaning head 2 is rotatable about its own axis and capable of moving on the LC panel 3 in any desired direction in pressing contact with the panel 3. A work stage 4 is partly cut away in order to receive the panel 3 therein and retain it during cleaning. A terminal seat 5 is pressed by a terminal portion 8 included in the panel 3 downward when the panel 3 is introduced into the work stage 4. A robot 7 pulls out one panel 3 from the cassette 6 and conveys it to a position above the work stage 4.

How the panel 3 is fed from the cassette 6 to the work stage 4 is as follows. After the cassette 6 accommodates a plurality of panels 3 has been mounted to the cleaning device, the robot 7 pulls out one panel 3 from the cassette 6 and conveys it to a position above the work stage 4. Assume that the panels 3 are stacked in the cassette 6 with their surfaces to be cleaned facing downward. Then, the robot 7 will be provided with a mechanism for turning over the panel 3 pulled out of the cassette 3 before it feeds the panel 3 toward the work stage 4.

Figure 6:
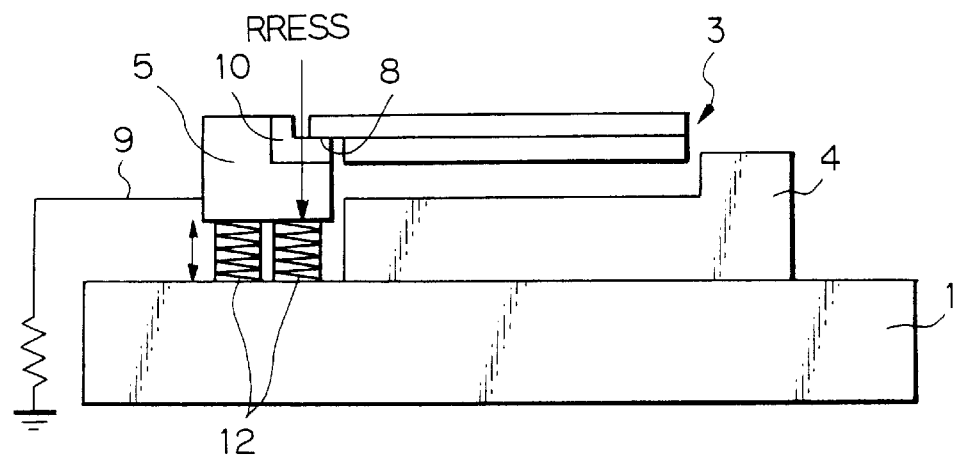
FIG. 6 is a side elevation showing the conveyance of an LC panel particular to the embodiment shown in FIG. 5.
Figure 7:
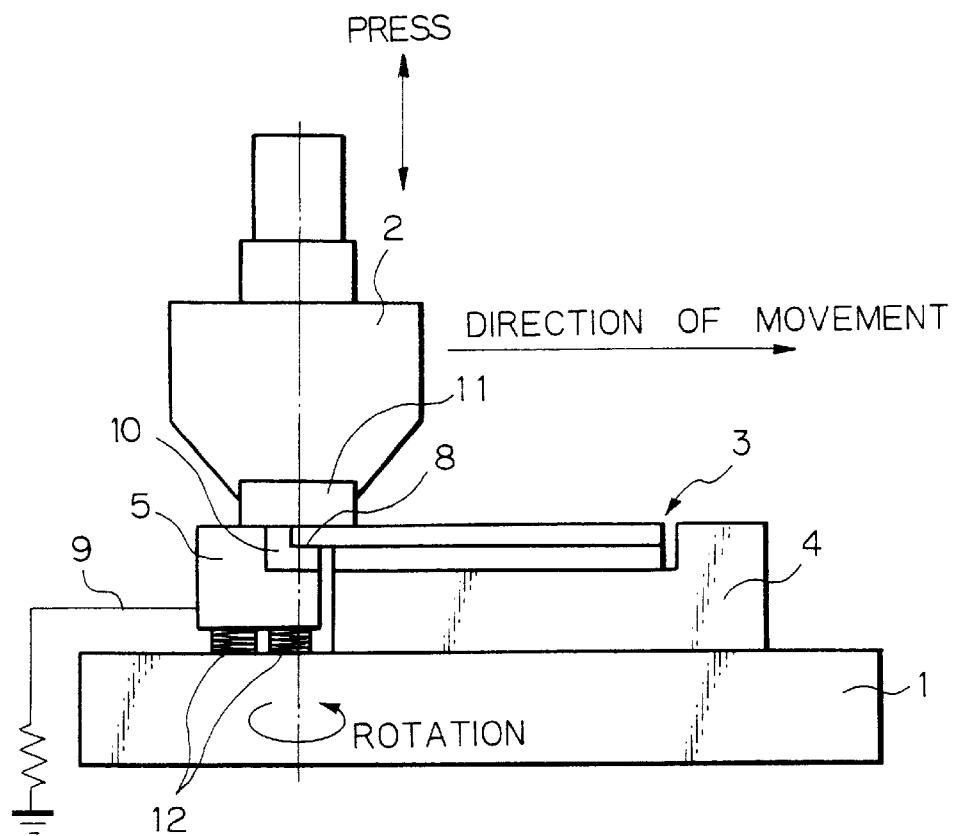
FIG. 7 is a side elevation demonstrating the operation of the embodiment shown in FIG. 5.
Figure 8:
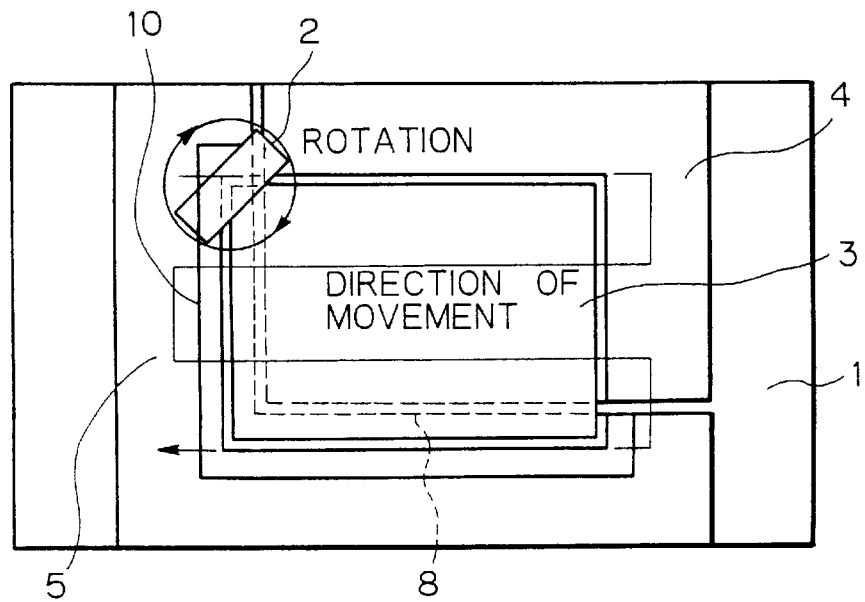
FIG. 8 is a plan view showing the direction in which a cleaning head included in the embodiment of FIG. 5 is moved during cleaning.

The configurations of the cleaning head 2, work stage 4 and terminal seat 5 will be described more specifically. As shown in FIG. 7, the head 2 is movable in any desired direction while pressing its abrasive member 11 against the surface of the panel 3. At this instant, the head 2 and therefore the abrasive member 11 rotates about is own axis indicated by a dash-and-dot line in FIG. 7. As shown in FIG. 6, the surface of the terminal seat 5 to contact the terminal portion 8 is covered with a conductive resin layer 10 in order to protect the portion 8 from scratches. The other portion of the terminal seat 5 is treated with metal for reinforcement. The terminal seat 5 is connected to ground by a ground line 9 and sustained by a spring or similar biasing member 12. When the panel 3 is lowered and received in the work stage 4, the terminal portion 8 of the panel 3 rests on the terminal seat 5 and forces it downward against the action of the spring 12. Further, a mechanism is provided for chucking the panel 3 retained by the work stage 4 and thereby preventing the panel 3 from moving despite the force of the head 2. The work stage 4 prevents the panel 3 from moving while the head 2 is in rotation. The work stage 4 is partly cut away complementarily to the contour of the panel 3, as stated earlier. This successfully absorbs the stepped configuration of the terminal portion 8.

In operation, the robot 7 conveys the panel 3 to the position above the work stage 4 and then lowers the former onto the latter. At this instant, the terminal portion 8 of the panel 3 rests on and forces the seat portion 5 downward against the action of the spring 12. After the panel 3 has been retained by the work stage 4, the terminal seat 5 is chucked. Subsequently, the head 2 rotating about its own axis, i.e., in the direction parallel to the panel 3 is lowered and caused to move zigzag such that the abrasive member 11 runs on the entire surface of the panel 3. As a result, the abrasive member 11 removes impurities from the entire surface of the panel 3.

Figure 9:
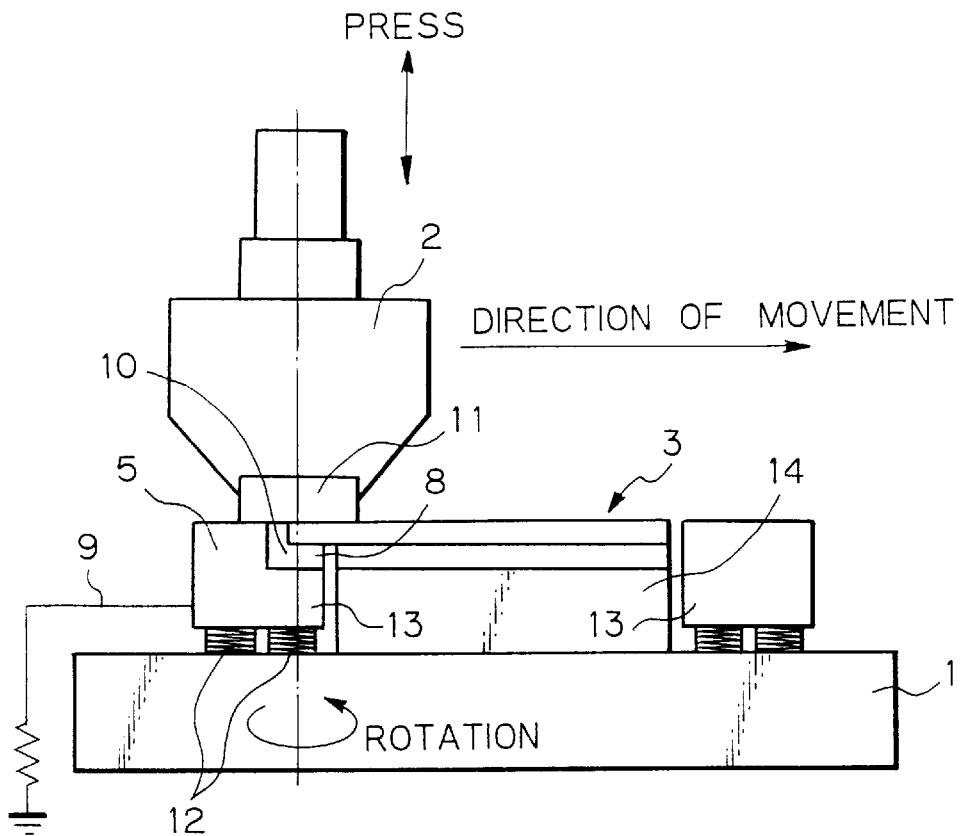
FIG. 9 is a side elevation showing the operation of an alternative embodiment of the present invention.
Figure 10:
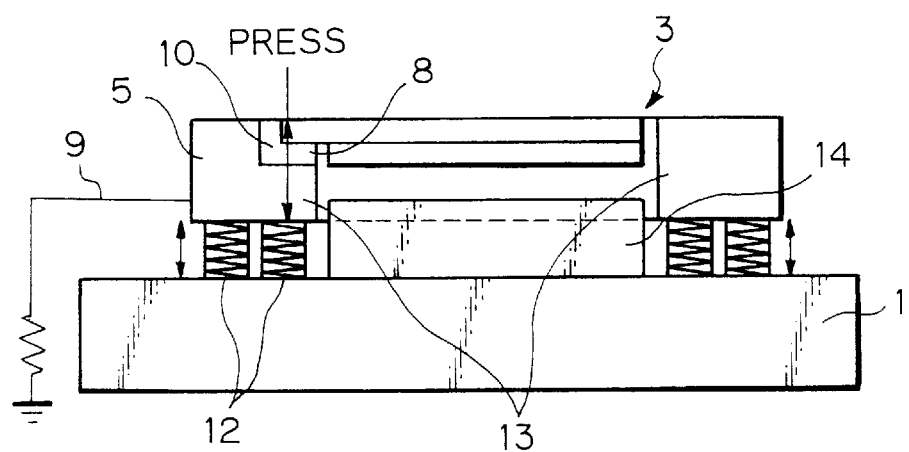
FIG. 10 is a side elevation showing the conveyance of an LC panel particular to the alternative embodiment.

Reference will be made to FIGS. 9 and 10 for describing an alternative embodiment of the present invention. As shown, the alternative embodiment includes a flat work stage 14 for retaining the LC panel 3. A guide 13 surrounds the work stage 14 and has a terminal seat 5 and a frame. The surface of the terminal seat 5 to contact the terminal portion 8 is covered with the conductive resin layer 10 in order to protect the portion 8 from scratches. The other portion of the terminal seat 5 is treated with metal for reinforcement. The terminal seat 5 is connected to ground by the ground line 9 and sustained by, e.g., the spring 12. When the panel 3 is lowered to rest on the work stage 14, the terminal portion 8 of the panel 3 rests on the spring seat 5 and forces it downward against the action of the spring 12. Further, the mechanism is provided for chucking the panel 3 retained by the work stage 14 and thereby preventing the panel 3 from moving despite the force of the head 2, as in the previous embodiment.

In operation, the panel 3 brought to a position above the work stage 14 is lowered onto the work stage 14 with its terminal portion 8 forcing the terminal seat 5 downward against the action of the spring 12. After the panel 3 has been retained by the work stage 14, the guide 13 is chucked. Subsequently, the head 2 rotating about its own axis, i.e., in the direction parallel to the panel 3 is lowered and caused to move zigzag such that the abrasive member 11 runs on the entire surface of the panel 3. As a result, the abrasive member 11 removes impurities from the entire surface of the panel 3.

In summary, it will be seen that the present invention provides an LC panel cleaning device capable of cleaning an LC panel without damaging a terminal portion included in the panel. Specifically, while the cleaning device is in operation, a spring seat included in a work stage sustains the terminal portion while resiliently yielding downward. The terminal portion therefore can surely contact the terminal seat without regard to the thickness of the LC panel or that of the terminal portion itself.

Moreover, the cleaning device of the present invention protects devices built in the LC panel from damage ascribable to shorting. This is because the terminal seat is connected to ground and releases static electricity to ground during cleaning operation, thereby preventing the panel from being charged.

Various modifications will become possible for those skilled in the art after receiving the teachings of the present disclosure without departing from the scope thereof.

What is claimed is:

1. A device for cleaning a surface of an LC panel including two substrates adhered together, said device comprising:

a cleaning head comprising a first mechanism for causing an abrasive member to rotate in a plane parallel to said LC panel and lowering said abrasive member such that a surface of said abrasive member comes into contact with the surface of said LC panel, and a second mechanism for causing said abrasive member to move in a desired direction while maintaining contact with the surface of said LC panel;

a work stage for retaining said LC panel; and a terminal seat for receiving a terminal portion of said LC panel when said LC panel is lowered onto said work stage by the force of said cleaning head, said terminal seat being pressed downward by said terminal portion against a force of a biasing member constantly biasing said terminal seat and said terminal portion.

2. A device as claimed in claim 1, wherein said terminal seat is connected to ground.

3. A device as claimed in claim 1, wherein said biasing member comprises a spring.

4. A device for cleaning a surface of an LC panel including two substrates adhered together, said device comprising:

a cleaning head comprising a first mechanism for causing an abrasive member to rotate in a plane parallel to said LC panel and lowering said abrasive member such that a surface of said abrasive member comes into contact with the surface of said LC panel, and a second mechanism for causing said abrasive member to move in a desired direction while maintaining contact with the surface of said LC panel;

a work stage for retaining said LC panel;

a terminal seat for receiving a terminal portion of said LC panel when said LC panel is lowered onto said work stage by the force of said cleaning head, said terminal seat being pressed downward by said terminal portion against a force of a biasing member constantly biasing said terminal seat; and a guide including said terminal seat partly cut away such that when said LC panel is retained by said work stage, said guide is flush with a surface of one of said two substrates including said terminal portion.

\* \* \* \* \*